(12) United States Patent
Stemmer et al.

(10) Patent No.: US 9,190,266 B1
(45) Date of Patent: Nov. 17, 2015

(54) HIGH CAPACITANCE DENSITY GATE DIELECTRICS FOR III-V SEMICONDUCTOR CHANNELS USING A PRE-DISPOSITION SURFACE TREATMENT INVOLVING PLASMA AND TI PRECURSOR EXPOSURE

(71) Applicant: The Regents of the University of California, Oakland, CA (US)

(72) Inventors: Susanne Stemmer, Goleta, CA (US); Varistha Chobpattana, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/469,964

(22) Filed: Aug. 27, 2014

(51) Int. Cl.
  *H01L 21/316* (2006.01)
  *H01L 21/02* (2006.01)
  *H01L 29/51* (2006.01)

(52) U.S. Cl.
  CPC ...... *H01L 21/02274* (2013.01); *H01L 21/0206* (2013.01); *H01L 21/0228* (2013.01); *H01L 21/02186* (2013.01); *H01L 21/02205* (2013.01); *H01L 21/02301* (2013.01); *H01L 21/02315* (2013.01); *H01L 29/517* (2013.01)

(58) Field of Classification Search
  CPC .................................................. H01L 21/02301
  See application file for complete search history.

(56) References Cited

U.S. PATENT DOCUMENTS

| | | | |
|---|---|---|---|
| 6,342,277 B1 | 1/2002 | Sherman | |
| 6,391,727 B1 | 5/2002 | Park | |
| 7,732,325 B2 | 6/2010 | Yang et al. | |
| 8,541,828 B2 * | 9/2013 | Hashim | C23C 16/02 257/296 |
| 8,623,770 B1 * | 1/2014 | Gao | H01L 21/02186 257/E21.236 |
| 2008/0087890 A1 * | 4/2008 | Ahn | C23C 16/405 257/43 |
| 2009/0011252 A1 | 1/2009 | Stein et al. | |
| 2010/0075510 A1 * | 3/2010 | Jan | C23C 16/405 438/785 |
| 2010/0102417 A1 | 4/2010 | Ganguli et al. | |
| 2013/0122713 A1 * | 5/2013 | Rogers | H01L 27/11521 438/715 |
| 2015/0170912 A1 * | 6/2015 | Ahmed | C23C 14/021 438/104 |

* cited by examiner

*Primary Examiner* — Stephen W Smoot
(74) *Attorney, Agent, or Firm* — Lumen Patent Firm

(57) ABSTRACT

A method of depositing a uniform dielectric thin film is provided that includes pre-cleaning a substrate surface, using a deposition apparatus, by exposing the substrate to a plasma, where the plasma can include a nitrogen plasma, a hydrogen plasma, an ammonia plasma, or a plasma containing nitrogen-hydrogen radicals in a plasma chamber of the deposition apparatus, where the substrate comprises a semiconductor of type III-V, and exposing the pre-cleaned substrate surface, using the deposition apparatus, to alternating cycles of the plasma, using the plasma chamber, and pulses of a precursor containing Ti, using a deposition chamber of the deposition apparatus, where less than 10% TiN or Ti—O—N bonding is present on said substrate surface, where a uniform substantially $TiO_2$ dielectric thin film is formed on said substrate.

5 Claims, 7 Drawing Sheets

US 9,190,266 B1

HIGH CAPACITANCE DENSITY GATE DIELECTRICS FOR III-V SEMICONDUCTOR CHANNELS USING A PRE-DISPOSITION SURFACE TREATMENT INVOLVING PLASMA AND TI PRECURSOR EXPOSURE

FIELD OF THE INVENTION

The current invention relates to semiconductor deposition. More particularly, the invention relates to a method of forming a $TiO_2$ layer on III-V semiconductors prior to deposition of $HfO_2$ and $ZrO_2$ gate stacks.

BACKGROUND OF THE INVENTION

III-V semiconductors have much lower carrier effective masses than Si, which allows for high velocities. They are currently under active investigation to replace Si as the channel in large-scale integrated digital circuits. The advantage of a low carrier mass is, however, offset by a low density of conduction band states, which limits achievable carrier densities and thus negatively affects the transistor transconductance. This issue has become known as the "density of states bottleneck". To allow for device scaling to nm-dimensions, gate dielectrics with very high dielectric constants (k) are required for large capacitance densities, low tunneling leakage, and to mitigate the density of states bottleneck.

To date, significant efforts have focused on optimizing the interface quality of high-k/III-V interfaces, with remarkable success. For example, the midgap trap densities ($D_{it}$) for gate stacks with high-k $HfO_2$ and $ZrO_2$ dielectrics, which can achieve sub-nm equivalent oxide thickness (EOT), are now in the $10^{12}$ cm$^{-2}$ eV$^{-1}$ range. Such interfaces allow for excellent transistor performance, including subthreshold slopes of 61 mV/dec and record transconductance. Near-ideal subthreshold slopes indicate that the interface is not degraded by interface traps. A common attribute of nearly all high quality high-k/III-V interfaces is the presence of an Al-oxide interface layer, which is either deposited intentionally, or forms during a pre-deposition cleaning process. For example, high-performance $HfO_2$ and $ZrO_2$ dielectrics use an in-situ, cyclic, pre-deposition tri-methylaluminum (TMA)/nitrogen plasma cleaning process that leads to the formation of a thin $Al_2O_3$ layer at the interface. The presence of $Al_2O_3$ severely limits capacitance (or equivalent oxide thickness, EOT) scaling, because the interface layer is connected in series with the high-k dielectric and $Al_2O_3$ has a very low dielectric constant (~8). Further EOT scaling will therefore require either significantly thinning this layer, or replacing it with one that has a higher capacitance density. Furthermore, this must be achieved without degrading other key properties, in particular, interface trap density and leakage.

Highly-scaled gate dielectric stacks with low leakage and low interface trap densities are required for complementary metal-oxide-semiconductor technology with III-V semiconductor channels. $HfO_2$ and $ZrO_2$ gate stacks with extremely high accumulation capacitance densities, low leakage current, low frequency dispersion, and low midgap interface trap densities are desired.

What is needed is an interface containing $TiO_2$, with only trace amounts of Ga-oxides or As-oxides, or As—As bonding are present to control leakage and frequency dispersion in high-k/III-V gate stacks.

SUMMARY OF THE INVENTION

A method of depositing a uniform dielectric thin film is provided that includes pre-cleaning a substrate surface, using a deposition apparatus, by exposing the substrate to a plasma, where the plasma can include a nitrogen plasma, a hydrogen plasma, an ammonia plasma, argon plasma, a fluorine plasma or a plasma containing nitrogen-hydrogen radicals in a plasma chamber of the deposition apparatus, where the substrate comprises a semiconductor of type III-V, and exposing the pre-cleaned substrate surface, using the deposition apparatus, to alternating cycles of the plasma, using the plasma chamber, and pulses of a precursor containing Ti, using a deposition chamber of the deposition apparatus, where less than 10% TiN or Ti—O—N bonding is present on the substrate surface, where a uniform substantially $TiO_2$ dielectric thin film is formed on the substrate.

According to one aspect of the invention, the alternating cycles comprises at least one plasma cycle and at least one precursor containing Ti cycle.

In another aspect of the invention, the deposition apparatus is an atomic layer deposition apparatus.

In a further aspect of the invention, the precursor containing Ti includes tetrakis(dimethylamino)titanium (TDMAT), tetrakis(diethylamino)titanium (TDEAT), titanium isopropoxide (TTIP), titanium organic compounds, titanium halides, titanium tetrachloride ($TiCl_4$), titanium bromide, or titanium iodide.

In yet another aspect of the invention, the plasma chamber is a remote plasma chamber or a direct plasma chamber.

DETAILED DESCRIPTION

Figure 1:
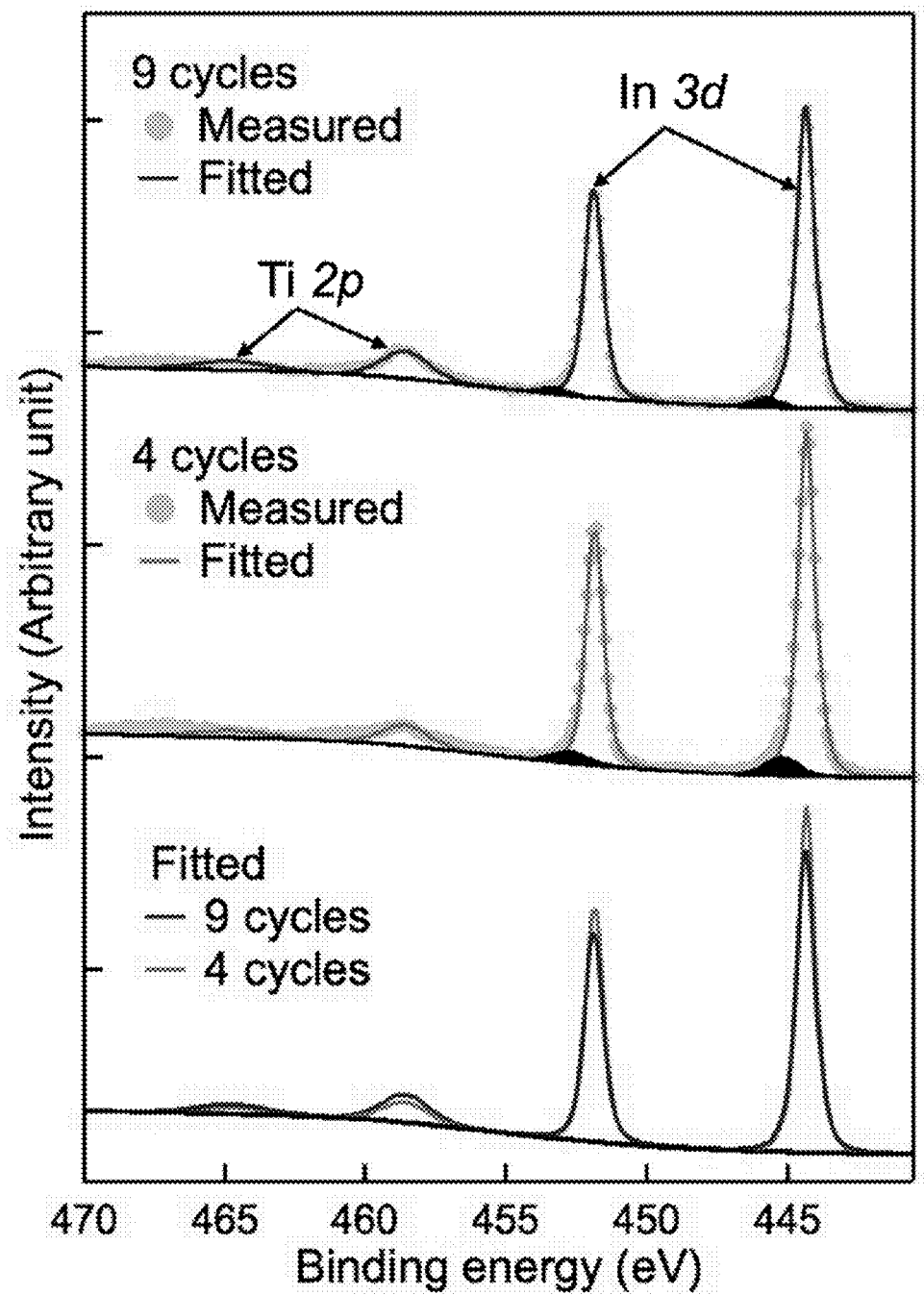
FIG. 1 shows In $3d$ and Ti $2p$ x-ray photoelectron spectroscopy (XPS) data for two samples with sufficiently thin (~1 nm) $ZrO_2$ dielectrics to allow for significant signal from the interface, according to one embodiment of the current invention.
Figure 2:
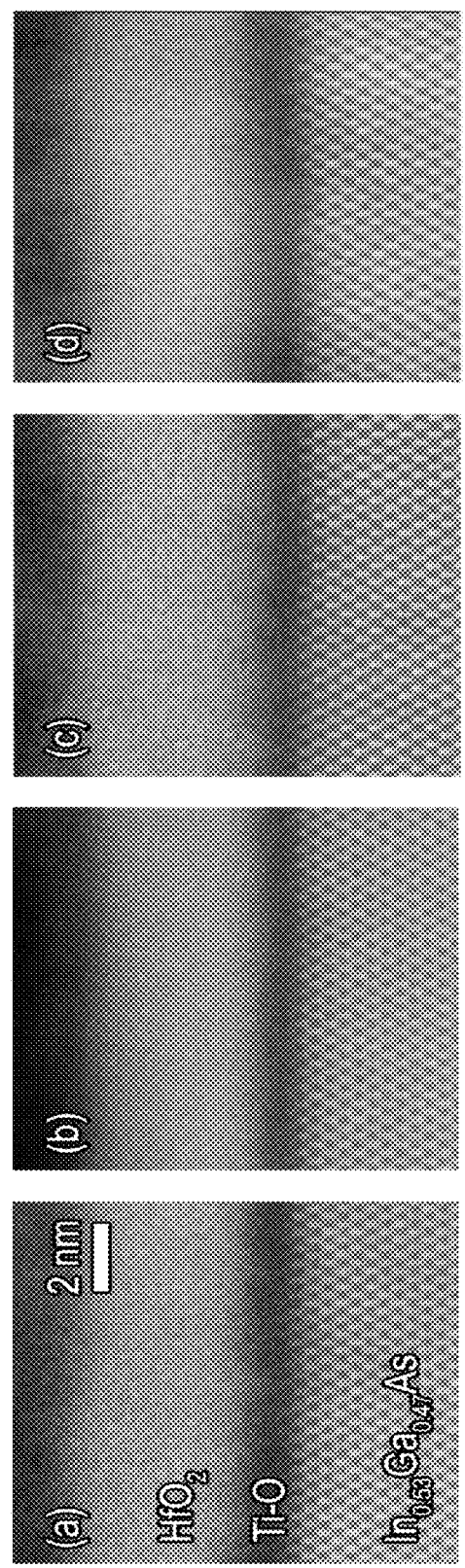
FIGS. 2a-2d show scanning transmission electron microscopy (STEM) images of four samples with ~4-nm $HfO_2$ dielectrics and Ni top contacts, according to embodiments of the current invention.
Figure 3:
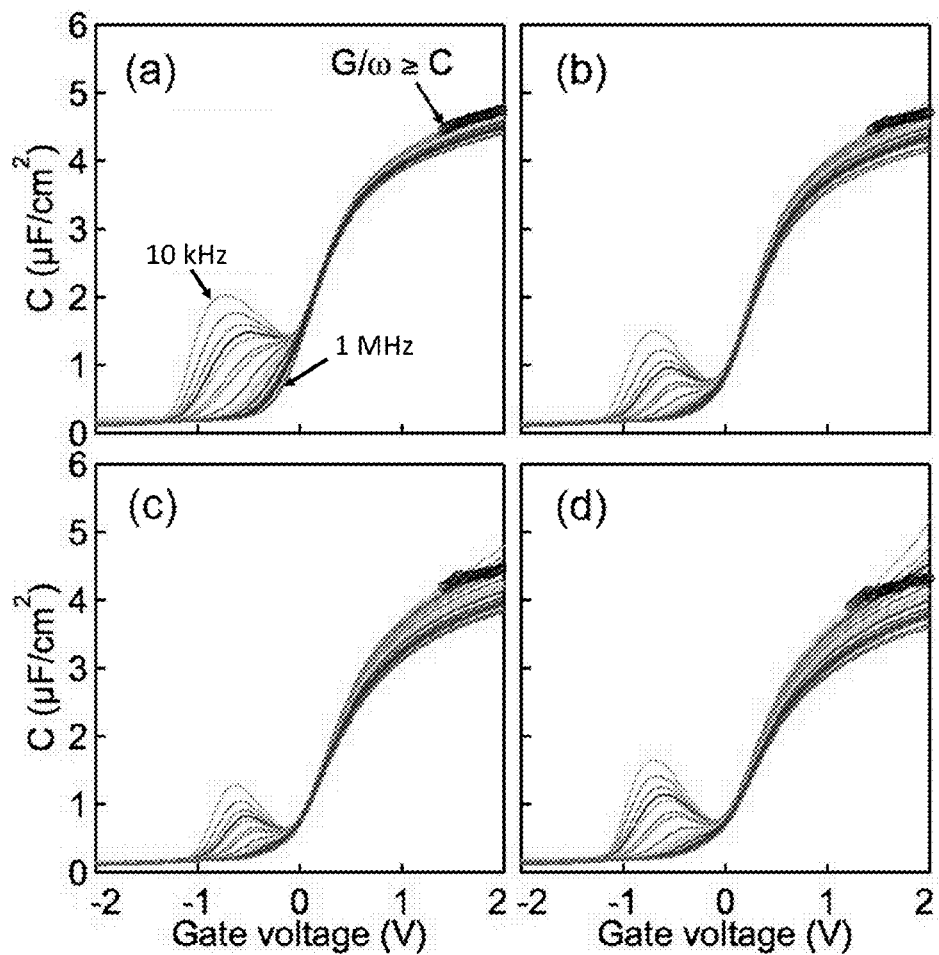
FIGS. 3a-3d show frequency-dependent CV characteristics of MOSCAPs from the four different samples for which the STEM images were shown in FIGS. 2a-2d, according to embodiments of the current invention.

To address the needs in the art, a method of depositing a uniform dielectric thin film is provided that includes pre-cleaning a substrate surface, using a deposition apparatus, by exposing the substrate to a plasma, where the plasma can include a nitrogen plasma, a hydrogen plasma, an argon plasma, a fluorine plasma, an ammonia plasma, or a plasma containing nitrogen-hydrogen radicals in a plasma chamber of the deposition apparatus, where the substrate comprises a semiconductor of type III-V, and exposing the pre-cleaned substrate surface, using the deposition apparatus, to alternating cycles of the plasma, using the plasma chamber, and pulses of a precursor containing Ti, using a deposition chamber of the deposition apparatus, where less than 10% TiN or Ti—O—N bonding is present on said substrate surface, where a uniform substantially $TiO_2$ dielectric thin film is formed on said substrate.

$TiO_2$ has among the highest dielectric constants of all binary oxides. Unlike the case for Si, $TiO_2$ is thermally stable in contact with III-V semiconductor. Furthermore, Ti has excellent oxygen gettering properties, which aids in the reduction of native III-V oxides that can be responsible for high $D_{it}$. Abrupt $TiO_2/In_{0.53}Ga_{0.47}As$ interfaces are possible. The current invention provides a method to replace the low-k Al-oxide interface layer with a higher-k Ti-oxide. This is achieved without degrading the interface quality. In combination with $ZrO_2$ and $HfO_2$ dielectrics, Ti-oxide-based interface passivation layers allow for extremely high capacitance densities that exceed the highest reported values by almost a factor of two, while maintaining low $D_{it}$. Crystalline $TiO_2$ has a negligible conduction band offset with $In_{0.53}Ga_{0.47}As$, and one may thus expect a large increase in leakage for n-type channels, compared to wide-band gap, Al-oxide based interlayers. Contrary to this expectation, we show that gate stacks with Ti-oxide based interface layers show low leakage, similar to what is found for gate stacks with $Al_2O_3$ interface layers. Furthermore, the frequency dispersion in accumulation, a known problem of high-k/III-V interfaces, is lower than that of aggressively scaled stacks with $Al_2O_3$ interface layers.

According to one embodiment, metal-oxide-semiconductor capacitor (MOSCAP) structures made of commercial n-type $In_{0.53}Ga_{0.47}As$ (Si: $1 \times 10^{17}$ cm$^3$) epitaxial layers grown by molecular beam epitaxy on (001) n$^+$-InP are used. The $In_{0.53}Ga_{0.47}As$ channel surface preparation was carried out in-situ in the atomic layer deposition (ALD) system, by exposing the surface to cycles having alternating exposures to nitrogen plasma and pulses of a precursor containing Ti such as tetrakis(dimethylamino)titanium (TDMAT), which is an ALD precursor for Ti-based layers. After a fixed number of cycles, $HfO_2$ and/or $ZrO_2$ dielectrics were deposited by ALD.

According to one aspect of the invention, the alternating cycles include at least one plasma cycle and at least one precursor containing Ti cycle.

In another aspect of the invention, the deposition apparatus is an atomic layer deposition apparatus.

In a further aspect of the invention, the precursor containing Ti includes tetrakis(dimethylamino)titanium (TDMAT), tetrakis(diethylamino)titanium (TDEAT), titanium isopropoxide (TTIP), titanium organic compounds, titanium halides, titanium tetrachloride ($TiCl_4$), titanium bromide, or titanium iodide.

In yet another aspect of the invention, the plasma chamber is a remote plasma chamfer or a direct plasma chamber.

FIG. 1 shows In $3d$ and Ti $2p$ x-ray photoelectron spectroscopy (XPS) data for two samples with sufficiently thin (~1 nm) $ZrO_2$ dielectrics to allow for significant signal from the interface. The $ZrO_2$ dielectric avoids the issue of Hf peaks overlapping with In, Ga, and As peaks, as is the case for $HfO_2$. In this exemplary embodiment, the surfaces were subjected to 9 and 4 nitrogen plasma/TDMAT cycles, respectively, prior to the dielectric ALD. The thin lines are fits to the experimental data. The fits to the In $3d^{5/2}$ peaks, at 444.3 eV, are consistent with InGaAs. Because of the overlap with As Auger and In loss signals, Ti $2p$ peaks were extracted by subtracting the signal from an ~1 nm $Al_2O_3/In_{0.53}Ga_{0.47}As$ sample without Ti. This background subtraction removed the low-intensity peaks at 461 and 468 eV, associated with As Auger. The Ti $2p^{3/2}$ peaks appear at 458.7 eV, consistent with $TiO_2$ bonding. Thus, the pre-deposition cycles are oxidizing. According to the invention, no TiN or Ti—O—N bonding was detected using XPS analysis, where the stoichiometry of the interface layer is substantially $TiO_2$, while non-stoichiometric TiOx or less than 10% nitrogen from the nitrogen plasma may be present. Comparison of the results for the two samples shows that the sample with 9 cycles of the pretreatment contained a greater amount of Ti than the interface subjected to 4 cycles, as the ratio of Ti:In increases from 0.65 to 0.92. A higher binding energy component (shaded area) of In $3d^{5/2}$ is detected at 445.3 eV, indicating the presence of $In_2O_3$. Quantification from the survey scans (not shown) and the high-resolution peaks suggest that the amount of $In_2O_3$ is approximately 0.3-0.4 at %. No signatures associated with Ga-oxide, As-oxide, As suboxide, or As—As bonding could be detected. Here, the interface layer is mostly $TiO_2$ with a small amount of $In_2O_3$, referred to here as Ti—O layer in the following.

FIGS. 2a-2d show scanning transmission electron microscopy (STEM) images taken in high-angle annular dark-field (HAADF) mode of four samples with ~4-nm $HfO_2$ dielectrics and Ni top contacts, subjected to the postdeposition anneal at 400° C. The samples were exposed to different number of cycles (9, 6, 4 and 2, respectively) of nitrogen plasma/TDMAT. A low-atomic-number amorphous layer that is ~1 nm thick is visible at the interface between $HfO_2$ and $In_{0.53}Ga_{0.47}As$, and thus likely corresponds to the Ti—O layer detected in XPS (Ti has a lower atomic number than Hf, causing the Ti—O layer to appear dark in HAADF imaging mode). While the $HfO_2$ contains small crystallites as a result of the anneal (visible as wormlike contrast in these images), the interface layer remains amorphous, mostly likely due to its small thickness, which affects the crystallization kinetics. The thickness of the amorphous Ti—O layer appears to be relatively independent of the number of pre-deposition cycles. This indicates that its thickness is self-limiting. If the thickness of the interfacial layer is approximately constant across the series, one would expect that the capacitance density of the stack increases with increasing number of cycles due to the increase in Ti content detected in XPS, which is indeed observed, as described next.

Figure 4:
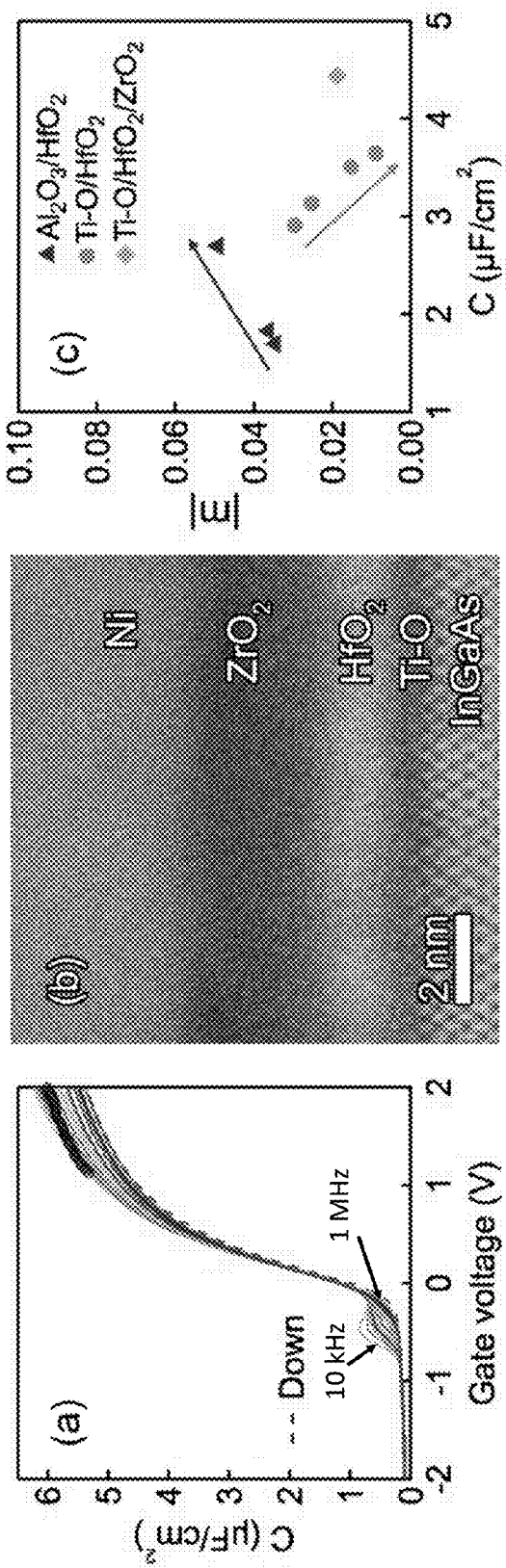
FIGS. 4a-4c show (4a) CV characteristics of $In_{0.53}Ga_{0.47}As$ MOSCAPs, (4b) a sample having an interface layer about 0.5 nm thick, and (4c) a measure of the frequency dispersion in accumulation, according to the current invention.

FIGS. 3a-3d show frequency-dependent CV characteristics of MOSCAPs from the four different samples for which the STEM images were shown in FIGS. 2a-2d, where the sample frequencies ranged between 1 kHz and 1 MHz. The capacitance density in accumulation (large positive gate bias) systematically increases with the number of pre-deposition cycles, and reaches about 4.5 µF/cm² at 1 MHz for the sample exposed to 9 cycles of nitrogen plasma/TDMAT (see FIG. 3a). Even higher capacitance densities can be achieved by optimizing the high-k stack. For example, $HfO_2/ZrO_2$ bilayers give excellent results. FIG. 4a shows the CV characteristics of $In_{0.53}Ga_{0.47}As$ MOSCAPs with ~1 nm $HfO_2$/~3 nm $ZrO_2$ subjected to 6 cycles of the nitrogen plasma/TDMAT pre-treatment. The accumulation capacitance density is 5.3 µF/cm² at 1 MHz and 2 V, almost twice that of other gate stacks reported in the literature, which are less than 3 µF/cm² at 1 MHz. This sample had an interface layer that was only about 0.5 nm thick (see STEM image in FIG. 4b), which is 50% thinner than that of the samples shown in FIGS. 3a-3d, and contributes to the higher capacitance density. In general, for n-type $In_{0.53}Ga_{0.47}As$, the oxide capacitance density ($C_{OX}$) should be higher than the accumulation capacitance density ($C_{acc}$), due to the low conduction band density of states, which adds a semiconductor capacitance in series with the oxide capacitance. The dielectric constant for amorphous $TiO_2$ can be as high as 40, while the dielectric constants for $HfO_2$ and $ZrO_2$ depend on their crystalline phase. The dielectric constant of tetragonal $ZrO_2$, which is kinetically stabilized in thin dielectrics, can be as high as 35-50. $HfO_2$ is typically monoclinic, with a low dielectric constant of about 18. If these three dielectrics are in series, $C_{OX}$ of this MOSCAP could approach values of 6 $\mu F/cm^2$, which is higher than the measured $C_{acc}$. While the contribution of the semiconductor capacitance to the accumulation capacitance can, in principle, be calculated, accurate modeling of $C_{acc}$ is currently not possible. At low frequencies, the measured accumulation capacitance may also suffer from artifacts from leakage. The black markers in the CV data in FIGS. 3a-3d and FIG. 4a indicate where C≥G/ω, where G is the measured conductance, and ω is the frequency. Values above this line are not a measure of the true capacitance density.

The CV characteristics indicate very high quality interfaces. For example, the ideal depletion capacitance value of 0.119 $\mu F/cm^2$ is reached, before entering deep depletion, as can be seen from the finite slope at negative gate biases. Deep depletion is one of the best indicators that the Fermi level is unpinned and moves into the lower half of the band gap. The CV hysteresis is very small. The dashed line in FIG. 4a indicates a hysteresis of ~0.06 V around flatband at 1 MHz. By sweeping to a smaller bias range, the hysteresis is reduced. This indicates that charge trapping in the oxide is small. The hysteresis may also have other origins such as generation of minority carriers in the semiconductor, if the CV is swept to high voltages. All CV show a steep slope in the transition to the accumulation. Furthermore, the frequency dispersion at negative biases ("hump"), which is now well established as being due to midgap $D_{it}$ response, is small. It increases with increasing number of pre-treatment cycles. Midgap $D_{it}$ is typically due to damage (defects) of the semiconductor. The results indicate that too many plasma cycles cause damage to the III-V surface.

In addition to the high capacitance density, the samples show remarkably low frequency dispersion in accumulation. All high-k/$In_{0.53}Ga_{0.47}As$ MOSCAPs, with the exception of those that employ a Si interfacial layer, show such frequency dispersion, and its origins are currently debated in the literature. The frequency dispersion is fairly modest for thick $Al_2O_3$ dielectrics, but increases significantly as the capacitance density is scaled. FIG. 4c shows a measure of the frequency dispersion in accumulation, expressed in terms of the coefficient m of a power law fit of the frequency dispersion ($C_{acc}=Af^m$, where $C_{acc}$ is the accumulation capacitance density at +1 V from flatband, A is a constant, and f is the frequency). FIG. 4c compares m for $HfO_2$ dielectrics and the bilayer MOSCAP, with $Al_2O_3$ and Ti—O interface layers, respectively, as a function of the maximum capacitance density at 1 MHz. For the $Al_2O_3$ interface layers, $C_{acc}$ increases with decreasing $HfO_2$ thickness and $C_{OX}$. In contrast, for the Ti—O interface layers, increasing the number of nitrogen plasma/TDMAT cycles (from 2 to 9), results in an increased capacitance density and Ti-content of the interface layer, but decreases the frequency dispersion in accumulation, as can also be seen from FIGS. 3a-3d. Note that the $ZrO_2/HfO_2$ bilayer stack, which has the highest capacitance density, was exposed to 6 cycles nitrogen plasma/TDMAT, and has a similar m as the 6 cycle $HfO_2$ MOSCAP with nitrogen plasma/TDMAT.

A complete theoretical description of the CV of high-k/III-V interfaces is still lacking. In particular, at least for n-type channels, the contribution of $D_{it}$ to the capacitance in accumulation appears to be non-negligible, even at 1 MHz, due to the fast response of traps near or in the conduction band, as described by:

$$\frac{1}{C_{acc}} = \frac{1}{C_{OX}} + \frac{1}{C_{Dit} + C_S}, \quad (1)$$

where $C_S$ and $C_{Dit}$ is the semiconductor and interface state capacitances, respectively. It is believed that the $D_{it}$ in the conduction band is very high. This precludes determination of the $D_{it}$ from CV-based methods, which assume that the only contribution of $D_{it}$ to the high-frequency CV is a stretch-out. Reliable values for the $D_{it}$ near midgap can be obtained from the conductance method, as described next.

Figure 5:
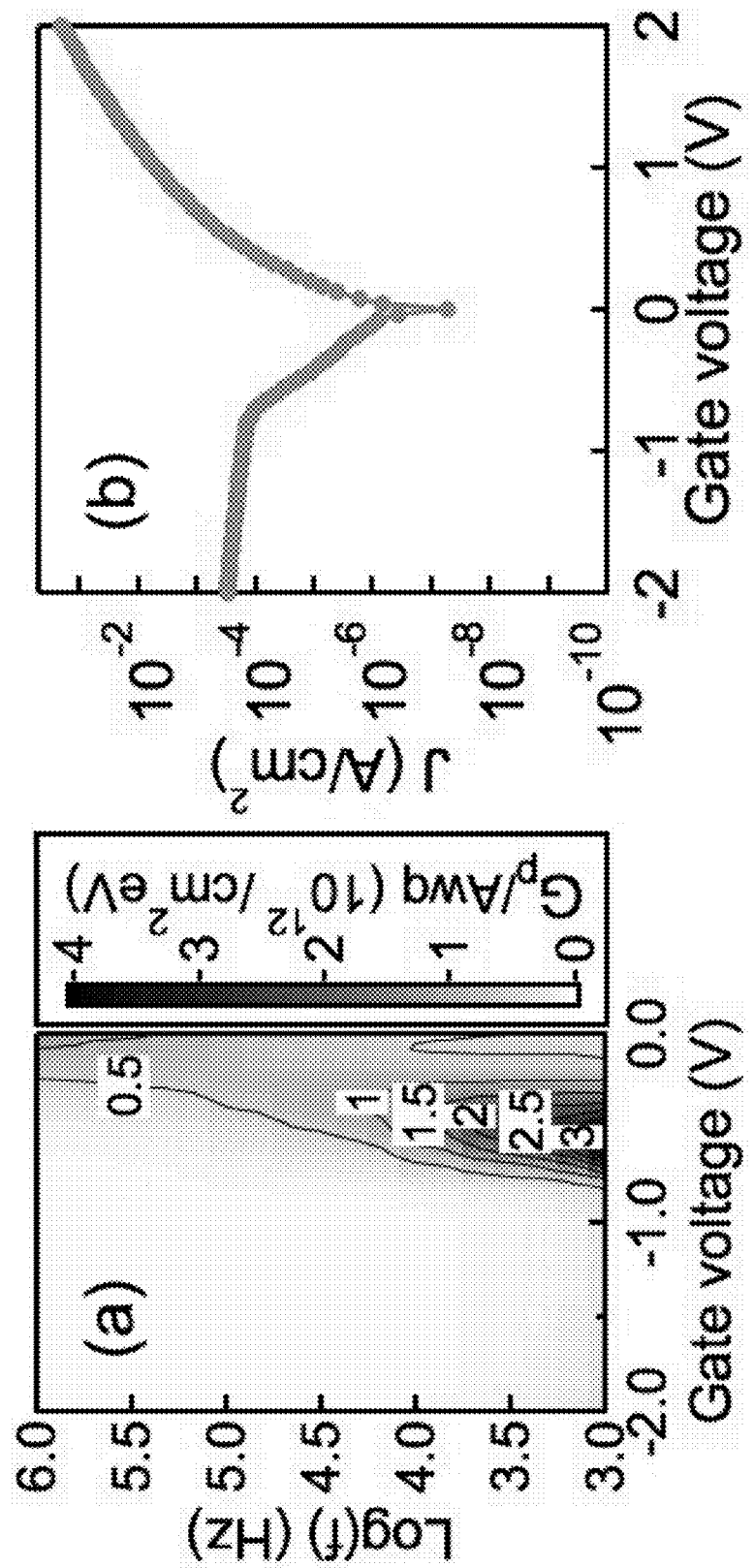
FIGS. 5a-5b show (5a) normalized parallel conductance peak values, $(G_p/A\omega q)_{max}$, and (5b) J/V curves for the sample for which the CV was shown in FIG. 4a, according to the current invention.

To provide a quantitative measure of $D_{it}$, FIG. 5a shows the normalized parallel conductance peak values, $(G_p/A\omega q)_{max}$, where $G_p$ is the parallel conductance, A the max capacitor area, ω the frequency, and q the elemental charge, as a function of voltage and ω, for the sample for which the CV was shown in FIG. 4a. The $D_{it}$ can be estimated by multiplying $(G_p/A\omega q)_{max}$ with a factor of ~2.5. Near midgap, the $D_{it}$ values are in the $10^{12}$ $cm^{-2}eV^{-1}$ range, very similar to what is obtained for the best interfaces with Al—O interlayers. Conductance maps also provide a measure of the efficiency of the Fermi level movement in the band gap. The $(G_p/A\omega q)_{max}$ peak shifts more than two orders of max magnitude in frequency as the gate bias is changed between −0.25 and −0.75 V, which indicates a large band bending in response to a change in gate bias.

Figure 6:
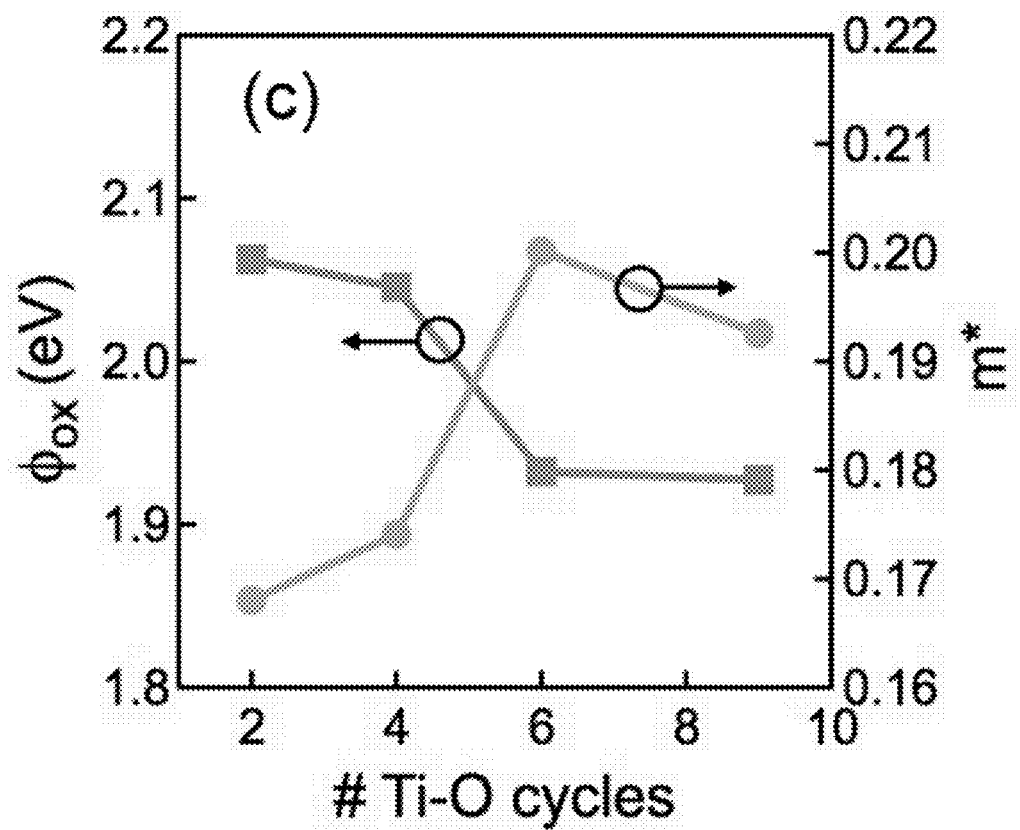
FIG. 6 shows are extracted parameters $\phi_{OX}$ and m* for the $HfO_2$ dielectrics with different number of nitrogen plasma/TDMAT cycles, according to one embodiment of the current invention.

Regarding the leakage current of the same MOSCAP as a function of gate voltage, the leakage current density is 5 $mA/cm^2$ at 1 V gate bias, which is below the limit specified by the international technology roadmap for semiconductors. Here, the leakage current density barely differs from that of $HfO_2$ MOSCAPs with $Al_2O_3$ interface layers and is lower than that of $ZrO_2$ MOSCAPs with $Al_2O_3$ interface layers. The leakage was measured to be at least an order of magnitude lower than that of other scaled III-V MOSCAPs. The leakage data are well described by direct tunneling:

$$J = \frac{q^2}{16\pi^2\hbar\phi_{OX}}E^2\exp\left(-\frac{4\sqrt{2m^*}\phi_{OX}^{3/2}}{3\hbar q}E\left(1-\left(1-\frac{V}{\phi_{OX}}\right)^{3/2}\right)\right), \quad (2)$$

where q, ℏ, E are the elementary charge, the reduced Planck's constant, and the electric field. The fit parameters were the effective barrier height $\phi_{OX}$ and the effective mass m*. The image-force-induced barrier lowering was included according to:

$$\Delta\phi = \sqrt{\frac{Eq^3}{4\pi\varepsilon_0\varepsilon_{OX}}}, \quad (3)$$

where the effective dielectric permittivity, $\in_{OX}$, was estimated to be ~40 for amorphous Ti—O and the fitting range was between 0 and +0.7 V. For a sample with 4 nm $HfO_2$ and 9 cycles of pre-treatment, the direct tunneling model describes the leakage data well. Shown in FIG. 6 are extracted parameters $\phi_{OX}$ and m* for the HfO$_2$ dielectrics with different number of nitrogen plasma/TDMAT cycles, it was observed that as the number of cycles increases, $\phi_{OX}$ decreases from 2.06 to 1.93 and m* increases from 0.17 to 0.2. Since the effects of barrier lowering and the increasing mass offset each other, the leakage current density remains fairly constant. Furthermore, the changes in both parameters are small, and the leakage current density barely differs from that of MOS-CAPs with Al$_2$O$_3$ interface layers. This is a surprising result, because the conductance band offset between crystalline TiO$_2$ and In$_{0.53}$Ga$_{0.47}$As is much smaller than between Al$_2$O$_3$ and In$_{0.53}$Ga$_{0.47}$As and a much large leakage current density would have been expected. The leakage data suggests that the effective barrier height is close to 2 eV, whereas the conduction band offset between TiO$_2$ and In$_{0.53}$Ga$_{0.47}$As is, at most, 0.6 eV.

In addition to providing a route to high-k/III-V interfaces with unprecedented high capacitance densities, low leakage and low D$_{it}$, the current invention is also relevant for several aspects of high-k/III-V interfaces that have been discussed extensively in the literature. The first relates to the origin of the large frequency dispersion that is seen in accumulation, which has been attributed to border traps, near interface traps in the semiconductor, and leakage. The precise origins of this frequency dispersion are important because they may negatively affect transistor parameters such as channel mobility or reliability. In general, the frequency dispersion in accumulation increases with the capacitance density, which can be understood from the simple lumped circuit model of the MOSCAP, expressed in Eq. (1): as C$_{OX}$ increases, the frequency dispersion caused by C$_{Dit}$ increases. Although Eq. (1) refers to the effect of the interface state capacitance, C$_{Dit}$, the lumped circuit models for border traps are basically similar, with the border trap capacitance replacing C$_{Dit}$. It is therefore every important that gate stacks of the same C$_{OX}$ are compared when comparing the amount of frequency dispersion.

The results here are contrary to the trend expected from Eq. (1), namely, increasing C$_{OX}$ by adding Ti to the interface layer decreases the dispersion. In particular, given the high C$_{OX}$, the low frequency dispersion is remarkable. The results show that modifying the chemistry of the interface, in particular replacing the ubiquitously employed Al—O, can lower the frequency dispersion. The results furthermore show a region very near the interface, confined to no more than the thickness of the interfacial layers itself, is key to the microscopic origin of the frequency dispersion. The high-k dielectrics and ALD process are the same in all samples and they should thus contain the same density of defects. This is in keeping with results from modeling of the frequency dispersion. It is interesting to note that the main difference in the chemistry of the interface layers in current invention and previously used Al-oxide layers is that Al is replaced with Ti—the amounts of In-oxide are the same as is the lack As-oxides and As—As bonding, at least within the detection limit of XPS. The current invention eliminates at least these defects as the origin of large frequency dispersion in accumulation.

Figure 7:
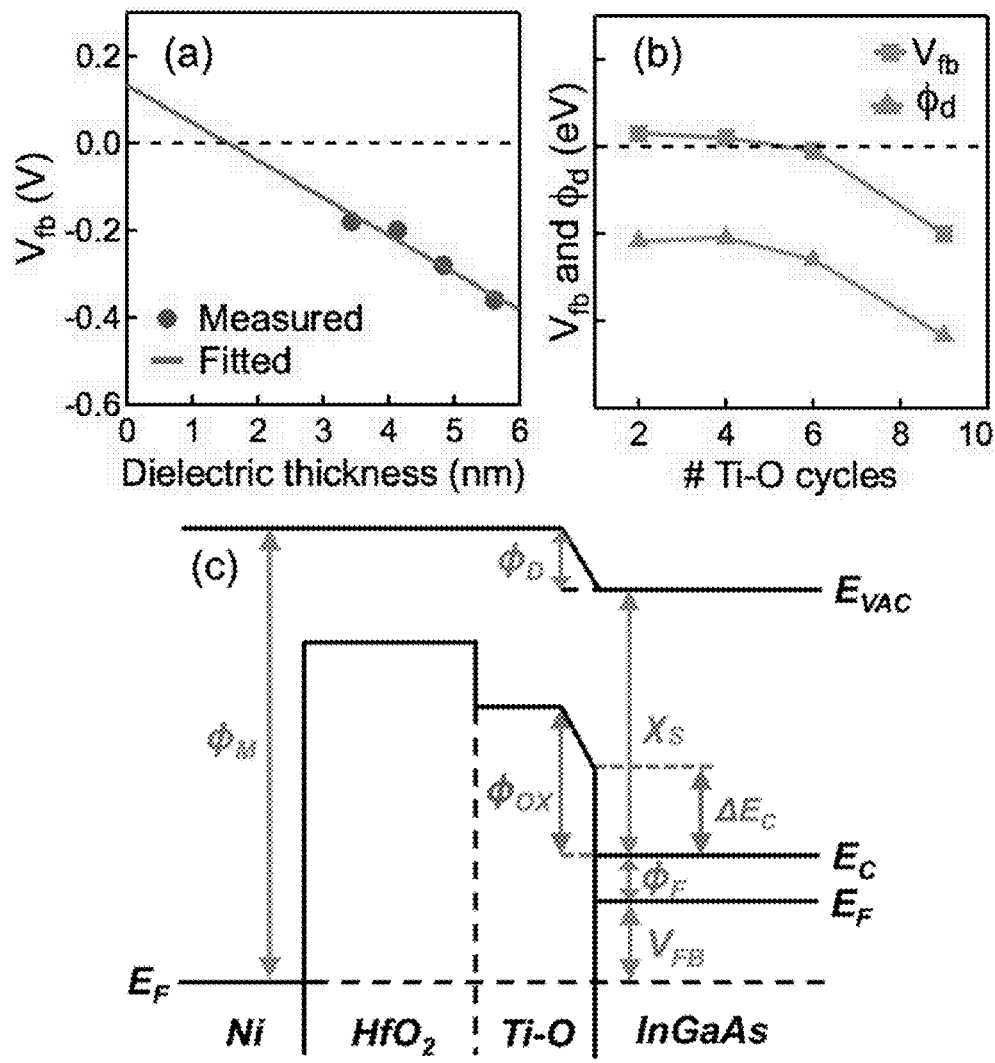
FIGS. 7a-7c show (7a) fixed charge at the interface, $Q_f$, determined from slope of a plot of $V_{FB}$ versus thickness, t, and an estimate for $\in_{OX}$, (7b) extracted dipole values and the flatband voltage for the samples with 2, 4, 6 and 9 cycles of pre-treatment, and (7c) a band diagram the negative dipole that serves to increase the effective barrier height, according to the current invention.

The second question relates to what controls the leakage current density in high-k/III-V MOSCAPs. In particular, here, a counterintuitive result was obtained, namely that inserting a low band gap, Ti—O layer at the interface does not change the leakage density from MOSCAPs containing a wide-band gap Al-oxide interface layer. It is presented here that interface dipoles may largely control the leakage properties of these interfaces. Evidence for such dipoles can be found in shifts in the flatband voltage (V$_{FB}$), according to:

$$\frac{V_{FB}}{q} = \phi_M - \chi_S - \phi_F - \frac{Q_f}{qC_{OX}} + \phi_D, \quad (4)$$

where $\phi_M$ is the effective workfunction of the metal, $\chi_S$ the affinity of the semiconductor, $\phi_D$ the potential drop due to a dipole layer, C$_{OX}$ the oxide capacitance, and $\phi_F$ is the Fermi energy, given by:

$$\phi_F = \frac{E_g}{2} - k_B T \ln\left(\frac{N_D}{n_i}\right), \quad (5)$$

where E$_g$ the band gap, k$_B$ is the Boltzmann constant, T the absolute temperature, and N$_D$ and n$_i$ the doping and intrinsic concentrations. In this system, $\phi_M$=5.15 eV, $\chi_S$=4.5 eV, and $\phi_F$=0.06 eV at 300 K, which gives ($\phi_M-\chi_S-\phi_F$)=0.59 eV. The fixed charge at the interface, Q$_f$, can be determined from slope of a plot of V$_{FB}$ versus thickness, t, and an estimate for $\in_{OX}$, as shown in FIG. 7a. The positive fixed charge density is estimated to be 1×10$^{13}$ cm$^{-2}$, which is about an order of magnitude higher than the fixed charge at the HfO$_2$/SiO$_2$ interface. The linear dependence of V$_{FB}$ on thickness indicates that the influence of oxide fixed charge is small. The intercept, which is smaller than ($\phi_M-\chi_S-\phi_F$), indicates the presence of a large negative dipole (the positive end of the dipole points to the semiconductor). The extracted dipole values and the flatband voltage for the samples with 2, 4, 6 and 9 cycles of pre-treatment are shown in FIG. 7b. V$_{FB}$ shifts to more negative bias as the Ti content in the interface layer is increases, and $\phi_D$ becomes more negative. A negative dipole serves to increase the effective barrier height, as shown in the band diagram in FIG. 7c. This results in a lower leakage than what would be expected from the band alignments alone. The results in FIG. 6, a decreasing band offset by 0.13 eV with increasing Ti-content, shows that increasingly negative interface dipole does not quite offset the change in band alignments.

In this example of one embodiment of the current invention, it is shown that by exposing In$_{0.53}$Ga$_{0.47}$As surfaces to a nitrogen plasma/TDMAT pre-treatment, extremely high capacitance densities can be achieved, through a combination of increasing the permittivity of the interfacial passivation layer with a highly polarizable Ti-oxide, and reducing its thickness to below what is currently possible with the commonly employed Al-oxide interface layers. The extreme increase in capacitance density was achieved without comprising the other key properties, namely D$_{it}$ and leakage density, which are both similar to those of the best III-V MOSCAPs with Al-oxide interlayers. Similar to previously employed nitrogen plasma/TMA pre-treatments, interfaces are free of Ga-oxides, As-oxides and As—As bonds, which can be a cause of high D$_{it}$. Such dielectric stacks should enable extremely scaled III-V transistors for logic devices.

The method of preparation of the above example included MOSCAP structures fabricated on 300-nm-thick, n-type In$_{0.53}$Ga$_{0.47}$As (Si: 1×10$^{17}$ cm$^{-3}$) epitaxial layers grown by molecular beam epitaxy on (001) n$^+$-InP (IntelliEpi, Richardson, Tex.). Surfaces were cleaned in buffered HF for 3 min before they were transferred to the ALD reactor (Oxford Instruments FlexAL ALD). The ALD substrate temperature was set at 300° C. Samples were heated in hydrogen atmosphere for 3 min. Alternating in-situ nitrogen plasma/TDMAT-pulse cycles were used immediately prior to dielectric deposition. Each of these cycles included a nitrogen gas setup step (3 s, 20 mTorr, 20 sccm), a nitrogen plasma pulse (2 s, 20 mTorr, 100 W inductively coupled plasma forward power), a pump step (2 s), a TDMAT dose (500 ms, 200 mTorr, Ar bubbler 100 sccm), a hold step (1 s), followed by purge (3 s) and pump (2 s). The deposition chamber was isolated from the plasma chamber during TDMAT dose to avoid contamination to the plasma chamber. Additional nitrogen plasma and pump steps were added to the end of these cycles. The hafnium and zirconium precursors were TEMAHf (tetrakis[ethylmethylamino]hafnium) and TEMAZr (tetrakis[ethylmethylamino] zirconium), respectively. Details of the high-k dielectric deposition are known in the art. Variable angle spectroscopic ellipsometry was used to determine the oxide thicknesses on Si pieces, and thickness were also confirmed using STEM. After ALD, plasma-enhanced chemical vapor deposition was used to deposit 500 nm of $SiO_2$ on the sample backside to protect the InP substrate. The samples were annealed at 400° C. for 15 min in a tube furnace in forming gas (95% $N_2$ and 5% $H_2$). A thermal evaporator was used to deposit metal contacts. 80-nm-thick Ni top contacts ($7.8 \times 10^{-5}$ cm$^2$) were evaporated through a shadow mask. The back Ohmic contact, having Cr (20 nm)/Au (100 nm), was deposited after $SiO_2$ removal.

Regarding electrical and physical characterization, frequency-dependent capacitance-voltage (CV) and conductance-voltage measurements were carried out in the dark from 1 kHz to 1 MHz using an impedance analyzer (Agilent 4294A). A 300 kV field-emission transmission electron microscope (FEI Titan 80-300) was used for obtaining high-angle annular dark-field scanning transmission electron microscopy (HAADF/STEM) images. The interface chemistry was investigated using X-ray photoelectron spectroscopy (XPS) (Kratos Axis Ultra DLD). Scans were run using monochromatic Al Kα radiation at a pass energy of 40 eV. The energy scales were calibrated by setting the surface aliphatic hydrocarbon peak to 285.0 eV.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed:

1. A method of depositing a uniform dielectric thin film, comprising:
   a. pre-cleaning a substrate surface, using a deposition apparatus or cleaning chamber, by exposing said substrate to a plasma, wherein said plasma is selected from the group consisting of a nitrogen plasma, a hydrogen plasma, an ammonia plasma, argon plasma, a fluorine plasma and a plasma containing nitrogen-hydrogen radicals in a plasma chamber of said deposition apparatus, wherein said substrate comprises a semiconductor of type III-V; and
   b. exposing said pre-cleaned substrate surface, using said deposition apparatus, to alternating cycles of said plasma, using said plasma chamber, and pulses of a precursor containing Ti, using a deposition chamber of said deposition apparatus, wherein less than 10% TiN or Ti—O—N bonding is present on said substrate surface, wherein a uniform substantially $TiO_2$ dielectric thin film is formed on said substrate.

2. The method according to claim 1, wherein said alternating cycles comprises at least one said plasma cycle and at least one said precursor containing Ti cycle.

3. The method according to claim 1, wherein said deposition apparatus comprises an atomic layer deposition apparatus.

4. The method according to claim 1, wherein said precursor containing Ti comprises tetrakis(dimethylamino)titanium (TDMAT), tetrakis(diethylamino)titanium (TDEAT), titanium isopropoxide (TTIP), titanium organic compounds, titanium halides, titanium tetrachloride ($TiCl_4$), titanium bromide, or titanium iodide.

5. The method according to claim 1, wherein said plasma chamber comprises a remote plasma chamber or a direct plasma chamber.

* * * * *

UNITED STATES PATENT AND TRADEMARK OFFICE
CERTIFICATE OF CORRECTION

| | | |
|---|---|---|
| PATENT NO. | : 9,190,266 B1 | Page 1 of 1 |
| APPLICATION NO. | : 14/469964 | |
| DATED | : November 17, 2015 | |
| INVENTOR(S) | : Susanne Stemmer | |

It is certified that error appears in the above-identified patent and that said Letters Patent is hereby corrected as shown below:

On the Title Page, Item (54) and in the Specification, Column 1 please substitute the title as follows:

HIGH CAPACITANCE DENSITY GATE DIELECTRICS FOR III-V SEMICONDUCTOR CHANNELS USING A PRE-DEPOSITION SURFACE TREATMENT INVOLVING PLASMA AND TI PRECURSOR EXPOSURE

Signed and Sealed this
Fifth Day of April, 2016

Michelle K. Lee
*Director of the United States Patent and Trademark Office*